(12) United States Patent
Chen

(10) Patent No.: US 7,098,486 B2
(45) Date of Patent: Aug. 29, 2006

(54) LIGHT SOURCE ASSEMBLY HAVING HIGH-PERFORMANCE HEAT DISSIPATION MEANS

(75) Inventor: Jeffrey Chen, Hsinchu (TW)

(73) Assignee: Neobulb Technologies, Inc., Bandar Seri Begawan (BN)

( * ) Notice: Subject to any disclaimer, the term of this patent is extended or adjusted under 35 U.S.C. 154(b) by 0 days.

(21) Appl. No.: 11/019,223

(22) Filed: Dec. 23, 2004

(65) Prior Publication Data

US 2006/0054911 A1    Mar. 16, 2006

(30) Foreign Application Priority Data

Sep. 13, 2004   (TW) ............................... 93127615 A

(51) Int. Cl.
*H01L 29/22* (2006.01)

(52) U.S. Cl. .................. 257/99; 257/707; 257/714; 257/E33.057; 257/E33.075

(58) Field of Classification Search ................ 257/99, 257/100, 88, 706, 707, 714, 721, 722, E33.057, 257/E33.058, E33.075; 362/373, 800; 361/699, 361/698, 694, 696, 689, 697
See application file for complete search history.

(56) References Cited

U.S. PATENT DOCUMENTS

| 6,843,307 B1* | 1/2005 | Yuyama et al. ........ 165/104.26 |
| 2004/0075100 A1* | 4/2004 | Bogner et al. ............... 257/99 |
| 2004/0261988 A1* | 12/2004 | Sauciuc et al. ............. 165/185 |

* cited by examiner

*Primary Examiner*—Minhloan Tran
*Assistant Examiner*—Benjamin Tzu-Hung Liu
(74) *Attorney, Agent, or Firm*—Rosenberg, Klein & Lee

(57) ABSTRACT

A light source assembly includes a vapor chamber, which has an electrical circuit installed in the top surface, an insulation layer covered in between the top surface of the vapor chamber and the electrical circuit, and light emitting diodes installed in the top surface directly of the vapor chamber and electrically connected to the electrical circuit for producing light upon connection of electricity to the electrode circuit means and the vapor chamber, and a heat sink installed in the bottom surface of the vapor chamber for dissipation of heat energy from the vapor chamber into outside open air.

11 Claims, 4 Drawing Sheets

LIGHT SOURCE ASSEMBLY HAVING HIGH-PERFORMANCE HEAT DISSIPATION MEANS

BACKGROUND OF THE INVENTION

1. Field of the Invention

The present invention relates to a light source and more particularly, to a light source assembly having high-performance heat dissipation means that dissipates heat efficiently during light emitting operation.

2. Description of the Related Art

Regular LCDs (liquid crystal displays) commonly have a backlight formed of a CCFL (Cold Cathode Fluorescent Lamp. Following fast development of semiconductor technology, LEDs (Light Emitting Diodes) have been intensively used to substitute for CCFLs. A CCFL has a certain thickness. Due to thickness problem, a CCFL is not an ideal light source for use in many small mobile electronic apparatus. Further, interference occurs when the voltage of a CCFL reaches 600V. Mercury contamination is another problem a CCFL may cause. Further, in comparison to natural light, color saturation of a CCFL reaches only about 70% of natural light. Therefore, it is the market tendency to substitute LEDs for CCFLs.

LEDs have been intensively used in many fields, for example, light source in the face panel of a stereo equipment, backlight for the buttons of a cellular phone, backlight for the display screen of a cellular phone. Following development of high brightness LEDs, the application of LEDs is greatly widened. For example, high brightness LEDs can be used for illumination purpose. However, high power LEDs (>0.5 W) consume much power and generate much more heat during working. Therefore, it is necessary to dissipate heat from high power LEDs during their operation.

SUMMARY OF THE INVENTION

The present invention has been accomplished under the circumstances in view. It is one object of the present invention to provide a light source assembly, which dissipates heat efficiently when turned on to emit light. It is another object of the present invention to provide a light source assembly, which dissipates heat efficiently so that light emitting devices can be installed in a high density manner. It is still another object of the present invention to provide a light source assembly, which dissipates heat efficiently for a wide range application.

To achieve these and other objects of the present invention, the light source assembly comprises a vapor chamber, which has a first surface, a second surface opposite to the first surface, and electrode circuit means installed in the first surface, an insulation layer covered in between the top surface of the vapor chamber and the electric circuit means, and a light source formed of a plurality of light emitting devices and installed in the first surface of the vapor chamber and electrically connected to the electric circuit means for generating light upon connection of electricity to the electric circuit means and the vapor chamber. It is important that, for giving a best thermal dissipation path, the light emitting devices should be directly placed on the top surface of the vapor chamber.

DETAILED DESCRIPTION OF THE PREFERRED EMBODIMENT

Figure 1:
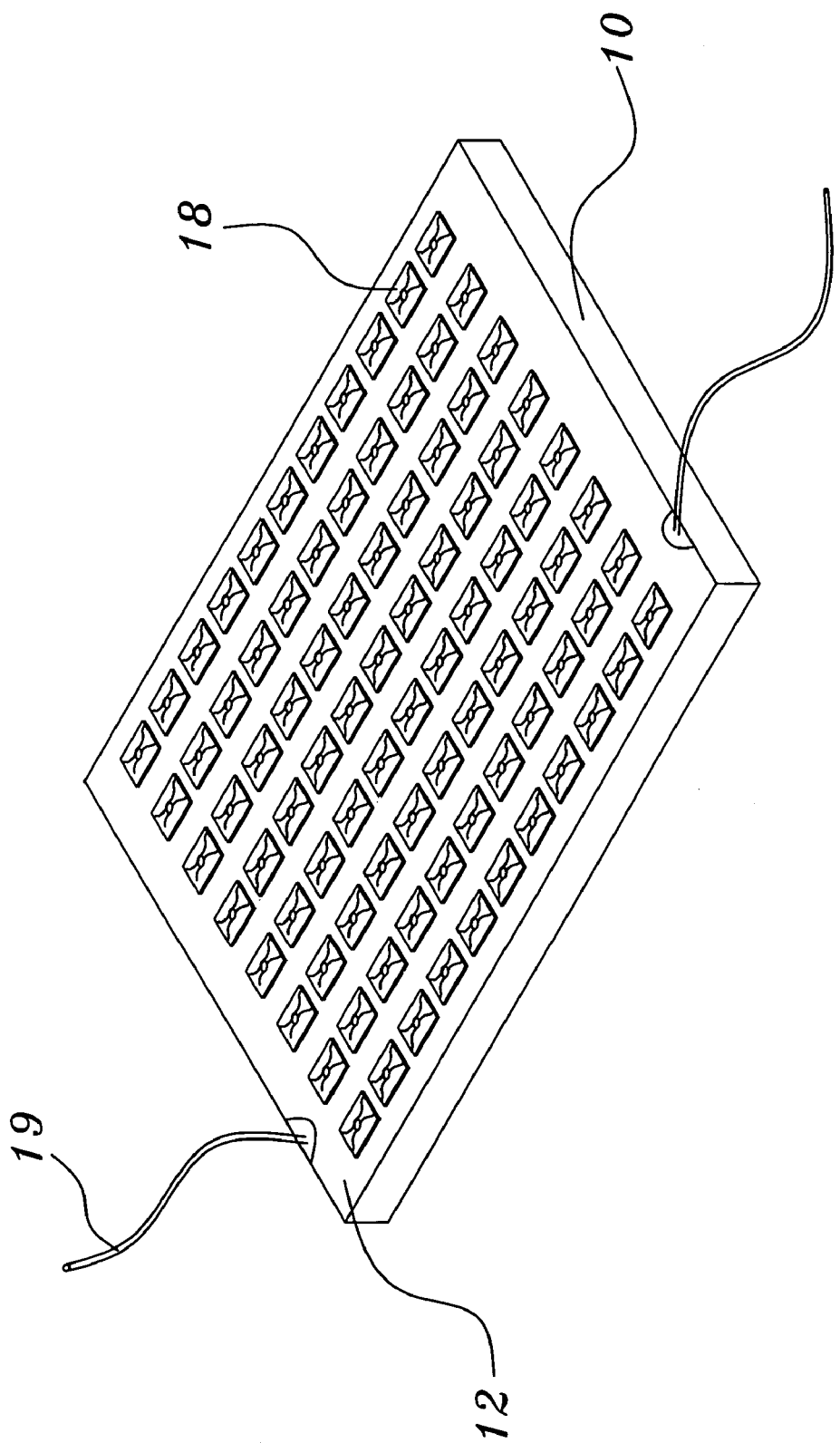
FIG. 1 is an elevational view of a light source assembly according to the present invention.
Figure 2:
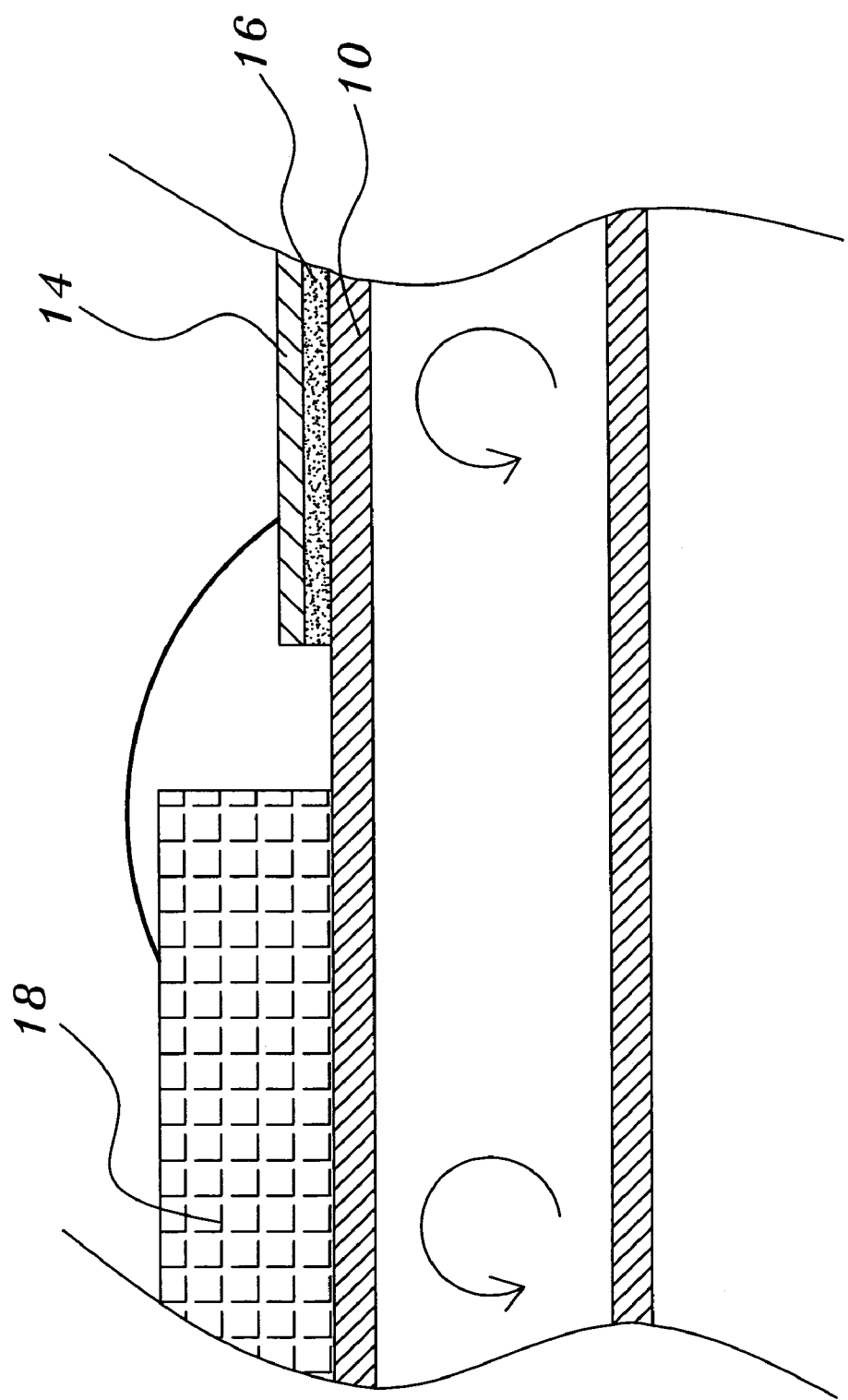
FIG. 2 is a schematic sectional view in an enlarged scale of a part of the light source assembly shown in FIG. 1.

Referring to FIGS. 1 and 2, a light source assembly in accordance with the present invention is shown comprised of a vapor chamber 10 and a light source formed of a plurality of light emitting devices 18. The vapor chamber 10 is filled with a work fluid (not shown) and maintained in a vacuum status. By means of a phase transfer of the working from liquid phase to vapor phase after absorption of heat, the vapor chamber 10 achieves rapid spreading of heat. The vapor chamber 10 is preferably made of copper, nickel, aluminum, or their alloy. The vapor chamber 10 has a top surface 12 and a bottom surface (not shown). An electric circuit 14 is installed in the top surface 12 of the vapor chamber 10. The electric circuit 14 is made of aluminum or copper. An insulation layer 16 is provided between the electric circuit 14 and the vapor chamber 10 to isolate the electric circuit 14 from the vapor chamber 10. The insulation layer 16 is formed of polymers or ceramics. The light emitting devices 18 are installed in the top surface 12 of the vapor chamber 10 and electrically connected with the vapor chamber 10. The light emitting devices 18 according to the present preferred embodiment are un-assembled chips of light emitting diode respectively electrically connected to the electric circuit 14 by wire bonding or soldering method to give electrically connected with the electric circuit 14 to the positive and negative poles of power supply by electric wires 19. When power is on, the electric circuit 14 and the vapor chamber 10 form a power circuit to turn on every light emitting device 18. Further, the vapor chamber 10 can be made in the form of a box, a flatted heat pipe, or heat tube. The electrical connection between each light emitting device 18 and the electric circuit 14 can be achieved by wire bonding or soldering process.

During working of the light emitting devices 18, every light emitting device 18 generates a certain amount of heat that is absorbed by the top surface 12 of the vapor chamber 10 and rapidly spread the heat to all surface besides the heating region, generally, the bottom surface is the most available one. Therefore, a heat dissipation structure may be installed in the bottom surface of the vapor chamber 10 to dissipate heat into outside open air. The heat dissipation structure can be formed of a heat sink 20 as shown in FIG. 3, or additional installation of the heat pipes 22 as shown in FIG. 4.

Figure 3:
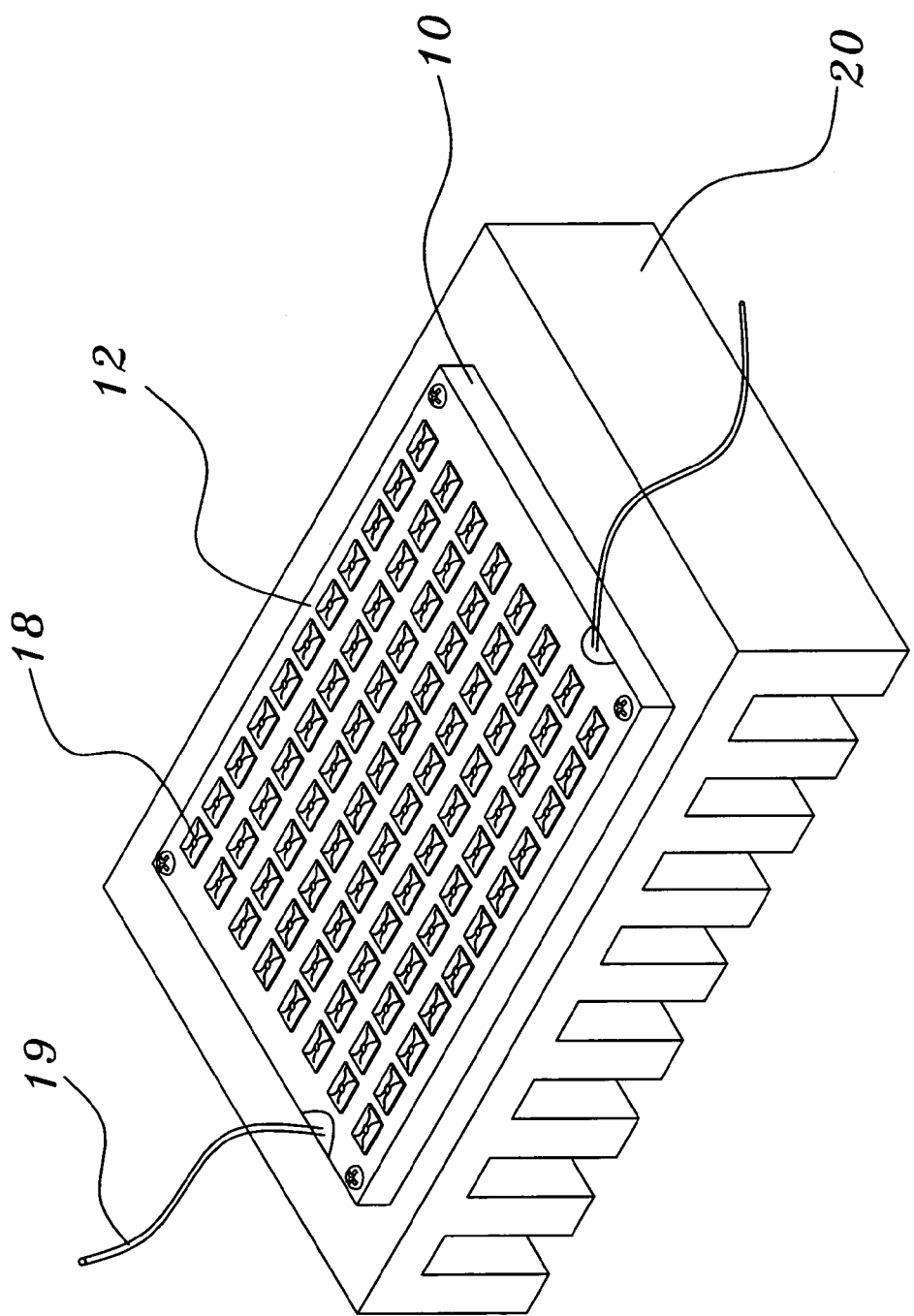
FIG. 3 illustrates a heat sink fastened to the bottom surface of the vapor chamber of the light source assembly according to the present invention.

Referring to FIG. 3, the heat sink 20 is fixedly fastened to the bottom surface of the vapor chamber 10 for dissipation of heat energy from the bottom surface of the vapor chamber 10 into outside open air. Further, a thermal interface material (TIM) may be filled in between the heat sink 10 and the vapor chamber 10 to lower thermal contact resistance.

Figure 4:
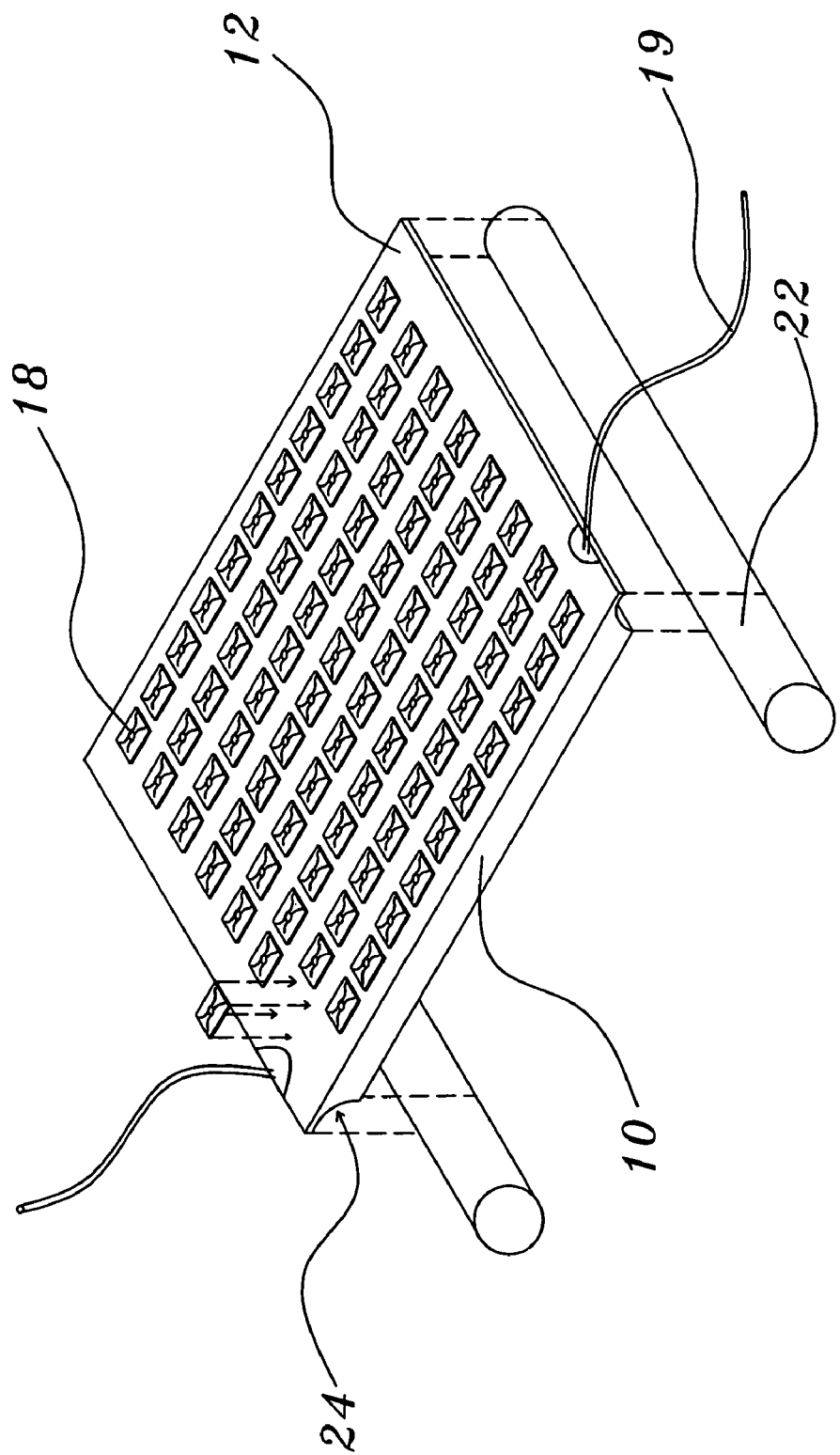
FIG. 4 illustrates heat pipes installed in respective bottom channels at the bottom side of the vapor chamber of the light source assembly according to the present invention.

Referring to FIG. 4, two channels 24 are symmetrically arranged along the two opposite lateral sides of the vapor chamber 10 at the bottom, and two heat pipes 22 are respectively mounted in the channels 24.

Referring to FIGS. 1~4, after installation of the heat dissipation structure in the bottom side of the vapor chamber 10, a protective layer of polymeric compound that admits light is covered on the top surface 12 of the vapor chamber 10 over the light emitting devices 18 for assembly structure protection.

When in use, the electric wires 19 are connected to the power source. When switched on power supply, the light emitting devices 18 are turned on to emit light. During working of the light emitting devices 18, the vapor chamber 10 absorbs heat energy from the light emitting devices 18 and transfers absorbed heat energy to the heat dissipation structure (of the heat sink 20 or heat pipes 22), which in turn dissipates heat energy into outside open air.

A prototype of light source assembly has been constructed with the features of FIGS. 1~4. The light source assembly functions smoothly to provide all of the features discussed earlier.

Although particular embodiments of the invention have been described in detail for purposes of illustration, various modifications and enhancements may be made without departing from the spirit and scope of the invention.

The invention claimed is:

1. A light source assembly comprising:
   a vapor chamber, said vapor chamber comprising a first surface defining an internal chamber therebeneath, a second surface disposed opposite to said first surface to enclose said internal chamber therebetween;
   electrical circuit means installed on said first surface;
   an insulation layer covered in between the top surface of said vapor chamber and said electrical circuit means; and
   a light source including at least one light emitting device and installed directly on the first surface of said vapor chamber and electrically connected to said electrical circuit means for producing light upon connection of electricity to said electrical circuit means.

2. The light source assembly as claimed in claim 1, wherein each said light emitting device is an unassembled chip of light emitting diode.

3. The light source assembly as claimed in claim 1, wherein said electrical circuit means is electrically connected to said light emitting device by wire bonding or soldering.

4. The light source assembly as claimed in claim 1, further comprising a heat dissipation device installed on said vapor chamber for dissipation of heat energy from said vapor chamber into outside open air.

5. The light source assembly as claimed in claim 4, wherein said beat dissipation device includes a heat sink installed on the second surface of said vapor chamber.

6. The light source assembly as claimed in claim 4, wherein said heat dissipation device includes at least one heat pipe installed on said vapor chamber.

7. The light source assembly as claimed in claim 6, wherein said heat dissipation device includes a heat sink installed on said vapor chamber.

8. The light source assembly as claimed in claim 1, further comprising a polymeric protection layer covered on the first surface of said vapor chamber and said light source for protecting said light source.

9. The light source assembly as claimed in claim 1, wherein said vapor chamber is made of a material selected from a higher thermal conductive metal group including: copper, aluminum, silver, nickel, and their alloy.

10. The light source assembly as claimed in claim 1, wherein said electrical circuit means is made of a material selected from an electrical conductive materials group including: copper, silver, nickel and aluminum.

11. The light source assembly as claimed in claim 1, wherein said insulation layer is formed of a material selected from a material group including polymers and ceramics.

* * * * *